(12) United States Patent
Wang et al.

(10) Patent No.: US 12,733,311 B2
(45) Date of Patent: Sep. 8, 2026

(54) DISPLAY PANEL

(71) Applicant: AUO Corporation, Hsinchu (TW)

(72) Inventors: Sheng-Chin Wang, Hsinchu (TW); Kuan-Hsun Chen, Hsinchu (TW); JianJia Su, Hsinchu (TW)

(73) Assignee: AUO Corporation, Hsinchu (TW)

( * ) Notice: Subject to any disclaimer, the term of this patent is extended or adjusted under 35 U.S.C. 154(b) by 364 days.

(21) Appl. No.: 18/542,772

(22) Filed: Dec. 18, 2023

(65) Prior Publication Data

US 2024/0379915 A1 Nov. 14, 2024

(30) Foreign Application Priority Data

May 12, 2023 (TW) ................................ 112117710

(51) Int. Cl.
*H10H 20/853* (2025.01)
*H10W 90/00* (2026.01)

(52) U.S. Cl.
CPC .......... *H10H 20/853* (2025.01); *H10W 90/00* (2026.01)

(58) Field of Classification Search
CPC ........................... H10H 20/853; H10H 20/854
See application file for complete search history.

(56) References Cited

U.S. PATENT DOCUMENTS 11,165,040 B2 11/2021 Jiang
11,169,420 B1 11/2021 Liao et al.
2017/0358604 A1* 12/2017 Lee ...................... H10D 86/451
2020/0259114 A1 8/2020 Jiang
2022/0238768 A1* 7/2022 Chien .................. H10H 20/855
2023/0246142 A1 8/2023 Chan et al.

FOREIGN PATENT DOCUMENTS

CN 103309092 9/2013
CN 107403871 11/2017
CN 111077702 4/2020
CN 112164761 1/2021
CN 114005918 A1 * 2/2022 ......... H01L 25/0753
TW I801122 5/2023

* cited by examiner

*Primary Examiner* — Mounir S Amer
(74) *Attorney, Agent, or Firm* — JCIPRNET

(57) ABSTRACT

A display panel includes a substrate, multiple display units, an optical layer, a first adhesive layer, and a second adhesive layer. The display units are disposed over the substrate. The optical layer is disposed on the display units. The first adhesive layer contacts a side surface of the substrate. The second adhesive layer is disposed between the first adhesive layer and the optical layer and contacts a surface of the optical layer facing the substrate, and an interface exists between the second adhesive layer and the first adhesive layer.

10 Claims, 4 Drawing Sheets

DISPLAY PANEL

CROSS-REFERENCE TO RELATED APPLICATION

This application claims the priority benefit of Taiwan application serial no. 112117710, filed on May 12, 2023. The entirety of the above-mentioned patent application is hereby incorporated by reference herein and made a part of this specification.

BACKGROUND

Technical Field

The invention relates to a light-emitting panel, and more particularly, to a display panel.

Description of Related Art

Micro-LED displays have advantages of power saving, high efficiency, high brightness and fast response time. Due to the extremely small size of micro-LEDs, a current method of manufacturing the micro-LED display is to use a mass transfer technology, i.e., use a micro-electromechanical array technology to pick and place micro-LED dies, so as to transfer a large number of the micro-LED dies to a circuit substrate all at once. However, since a yield of the mass transfer technology still needs to be improved, a current approach is to first manufacture small-sized display panels and then splice the display panels into a large-sized display device.

In order to achieve seamless splicing, a side sealant and an optical layer around the display panel need to be cut so that the display panel has a predetermined size. However, due to the presence of bubbles in the side sealant, uneven force is applied to the optical layer when cutting to the optical layer, resulting in an uneven cutting surface of the optical layer and even a peeling off phenomenon.

SUMMARY

The invention provides a display panel with an improved cutting yield.

An embodiment of the invention provides a display panel including a substrate, multiple display units disposed over the substrate, an optical layer disposed on the display units, a first adhesive layer contacting a side surface of the substrate, and a second adhesive layer disposed between the first adhesive layer and the optical layer and contacting a surface of the optical layer facing the substrate. An interface exists between the second adhesive layer and the first adhesive layer.

In an embodiment of the invention, the second adhesive layer and the first adhesive layer have different compositions.

In an embodiment of the invention, there are bubbles in the first adhesive layer.

In an embodiment of the invention, a surface of the first adhesive layer facing away from the substrate has bubble holes.

In an embodiment of the invention, a viscosity of the second adhesive layer before curing is less than a viscosity of the first adhesive layer before curing.

In an embodiment of the invention, the optical layer includes an encapsulant and an optical film, and the encapsulant is located between the substrate and the optical film and between the display units.

In an embodiment of the invention, the encapsulant is further located between the second adhesive layer and the optical film.

In an embodiment of the invention, a side surface of the second adhesive layer, a side surface of the encapsulant, and a side surface of the optical film are aligned with each other.

In an embodiment of the invention, the second adhesive layer covers the side surface of the encapsulant.

In an embodiment of the invention, a surface of the second adhesive layer facing away from the encapsulant is aligned with a side surface of the optical film.

In order for the aforementioned features and advantages of the invention to be more comprehensible, several embodiments accompanied with drawings are described in detail as follows.

DESCRIPTION OF THE EMBODIMENTS

Figure 1A:
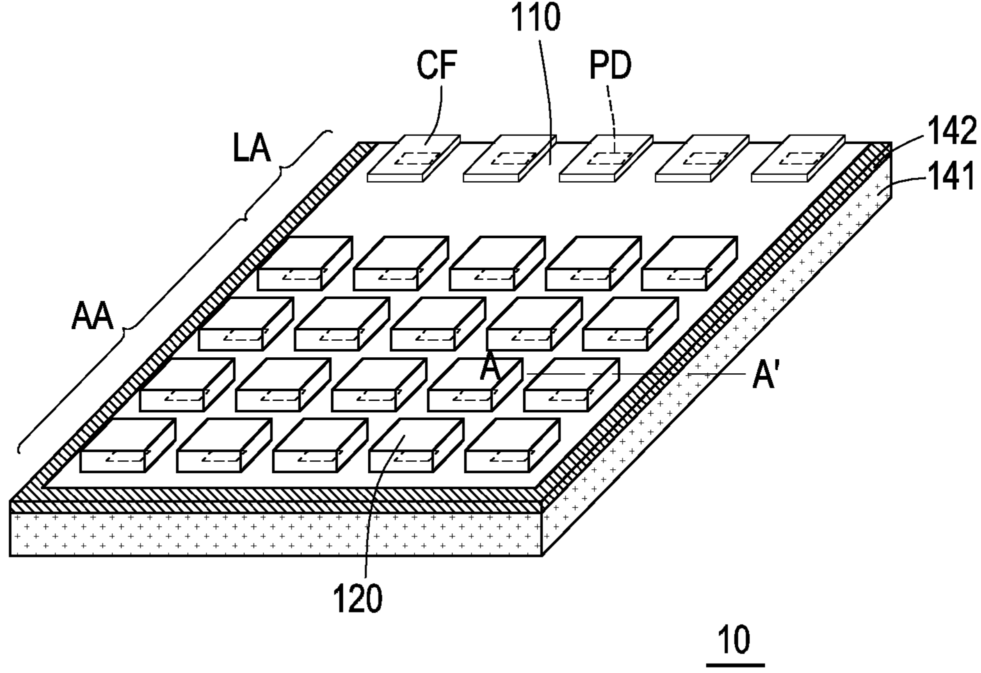
FIG. 1A is a schematic partial top view of a display panel 10 according to an embodiment of the invention.

In the drawings, the thickness of layers, films, panels, regions, etc., are exaggerated for clarity's sake. It will be understood that when a component such as a layer, a film, a region, or a substrate is referred to be "on" or "connected to" another component, it may be directly on or connected to the other another component, or intermediate components may also exist there between. Comparatively, when a component is referred to be "directly on" or "directly connected" to another, none other intermediate component exits there between. As used herein, the "connection" may refer to physical and/or electrical connection. Furthermore, "electrical connection" or "coupling" of two components may refer to that other components may exist between the two components.

It should be noted that although the terms "first", "second", "third", etc. may be used for describing various elements, components, regions, layers and/or portions, the elements, components, regions, layers and/or portions are not limited by these terms. These terms are only used for separating one element, component, region, layer or portion from another element, component, region, layer or portion. Therefore, the following discussed first "element", "component", "region", "layer" or "portion" may be referred to as the second element, component, region, layer or portion without departing from the scope of the disclosure.

The terminology used herein is for the purpose of describing particular embodiments and is not intended to be limiting of the disclosure. As used herein, the singular forms "a," "an" and "the" are intended to include the plural forms as well, unless the context clearly indicates otherwise. "or" represents "and/or". The term "and/or" used herein includes any or a combination of one or more of the associated listed items. It will be further understood that the terms "comprises," "comprising," "includes" and/or "including," when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "under" or "bottom" and "above" or "top" may be used for describing a relationship of one element and another element as that shown in figures. It should be noted that the relative terms are intended to include a different orientation of the device besides the orientation shown in the figure. For example, if a device in a figure is flipped over, the element originally described to be located "under" other element is oriented to be located "above" the other element. Therefore, the illustrative term "under" may include orientations of "under" and "on", which is determined by the specific orientation of the figure. Similarly, if a device in a figure is flipped over, the element originally described to be located "below" or "underneath" other element is oriented to be located "on" the other element. Therefore, the illustrative term "under" or "below" may include orientations of "above" and "under".

Considering a specific amount of measurement and measurement related errors discussed (i.e., limitations of a measurement system), the terms "about", "substantial" or "approximate" used herein include the related value and an average within an acceptable deviation range for a specific value determined by those skilled in the art, considering a discussed measurement and a specific number of errors related to the measurement (i.e. a limitation of a measuring system). For example, "about" may represent a range within one or more standard deviations of the related value, or within ±30%, ±20%, ±10%, ±5%. Moreover, the "about", "substantially", or "approximate" used herein may be a more acceptable deviation range or standard deviation based on optical properties, etching properties, or other properties, and not one standard deviation may be applied to all properties.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the disclosure should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the disclosure.

Figure 1B:
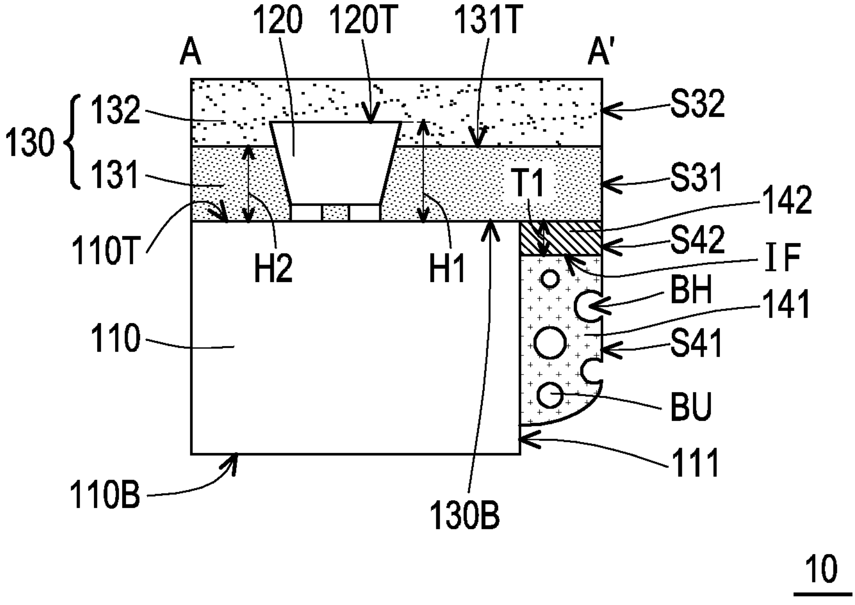
FIG. 1B is a schematic cross-sectional view viewing along a section line A-A' in FIG. 1A.

FIG. 1A is a schematic partial top view of a display panel 10 according to an embodiment of the invention. FIG. 1B is a schematic cross-sectional view viewing along a section line A-A' in FIG. 1A. In order to simplify the expression of the diagram, FIG. 1A schematically illustrates a substrate 110, display units 120, a first adhesive layer 141 and a second adhesive layer 142, and omits other components.

Referring to FIG. 1A and FIG. 1B, the display panel 10 includes: the substrate 110, multiple display units 120, an optical layer 130, the first adhesive layer 141 and the second adhesive layer 142. The display units 120 are disposed over the substrate 110. The optical layer 130 is disposed on the display units 120. The first adhesive layer 141 contacts a side surface 111 of the substrate 110. The second adhesive layer 142 is located between the first adhesive layer 141 and the optical layer 130. The second adhesive layer 142 contacts a surface 130B of the optical layer 130 facing the substrate 110, and there is an interface IF between the second adhesive layer 142 and the first adhesive layer 141.

In the display panel 10 according to an embodiment of the invention, by providing the second adhesive layer 142 that is less likely to contain bubbles, a flatness of a cutting surface of the optical layer 130 may be improved, thereby improving a cutting yield of the display panel 10. The following will continue to describe implementation of each element of the display panel 10 with reference to FIG. 1A and FIG. 1B, but the invention is not limited thereto.

In some embodiments, the substrate 110 of the display panel 10 may be a circuit substrate. For example, the substrate 110 may include components or circuits required for the display panel 10, such as a driving device, a switch device, a storage device, a power line, a driving signal line, a timing signal line, a current compensation line, a detection signal line, etc. In some embodiments, the substrate 110 includes a switch device array. In some embodiments, the substrate 110 includes multiple pads PD for electrically connecting the substrate 110 to the outside. In some embodiments, the substrate 110 has a top surface 110T and a bottom surface 110B opposite to each other and a side surface 111, and the side surface 111 connects the top surface 110T and the bottom surface 110B. In some embodiments, the pads PD are disposed on the top surface 110T of the substrate 110.

In some embodiments, the display panel 10 may have a display area AA and an external pin wiring area LA. In some embodiments, the external pin wiring area LA is located on one side of the display area AA. In some embodiments, the pads PD are disposed in the display area AA and the external pin wiring area LA.

In some embodiments, the display units 120 are disposed on the top surface 110T of the substrate 110, and the display units 120 are only disposed in the display area AA, and the display units 120 are not disposed in the external pin wiring area LA. In some embodiments, the display units 120 may be arranged on the substrate 110 in an array. In some embodiments, the display unit 120 may include a light-emitting diode, such as a micro light-emitting diode (micro-LED) or an organic LED (OLED). In some embodiments, the display unit 120 may be electrically connected to the substrate 110 through the pads PD on the substrate 110.

In some embodiments, the optical layer 130 includes an encapsulant 131 and an optical film 132, and the encapsulant 131 is located between the substrate 110 and the optical film 132. In some embodiments, the encapsulant 131 is also located on the top surface 110T of the circuit substrate 110 and between the display units 120. In some embodiments, the encapsulant 131 is only located in the display area AA and does not extend to the external pin wiring area LA. In some embodiments, the encapsulation glue 131 may include a suitable glue material, such as epoxy resin, but the disclosure is not limited thereto. In some embodiments, the display panel 10 is an opaque display panel, and the encapsulant 131 includes an anti-reflective material, such as a black light-absorbing material. In some embodiments, a level of the top surface 131T of the encapsulant 131 is lower than or equal to a level of the top surface 120T of the display unit 120 to expose a light-emitting surface of the display unit 120. In some embodiments, a height H2 of the encapsulant 131 is less than or equal to a height H1 of the display unit 120. In some embodiments, the encapsulant 131 is also located between the second adhesive layer 142 and the optical film 132.

In some embodiments, the optical film 132 is disposed in the display area AA, and the optical film 132 is located on the display units 120 and the encapsulant 131. The optical film 132 may be fixed on the encapsulant 131 and the display units 120 through an optical glue (such as silicone glue or polyurethane reactive glue). In some embodiments, the optical film 132 includes multiple film layers, such as a polarizer, an anti-glare film, an anti-reflective film, or other suitable optical films.

In some embodiments, the first adhesive layer 141 and the second adhesive layer 142 are both disposed on the side surface 111 of the substrate 110. In some embodiments, the second adhesive layer 142 is located between the optical layer 130 and the first adhesive layer 141. In some embodiments, a thickness T1 of the second adhesive layer 142 is 1 μm to 250 μm, such as 50 μm, 100 μm or 200 μm. In some embodiments, the second adhesive layer 142 physically contacts a surface 130B of the encapsulant 131 facing away from the optical film 132 and the side surface 111 of the substrate 110, thereby sealing an interface between the encapsulant 131 and the substrate 110. The second adhesive layer 142 may be formed by using a material with low viscosity, high fluidity, and low bubble content. In some embodiments, the viscosity of the second glue layer 142 before curing is 1 centi-poise (cp) to 2000 cp, such as 300 cp, 600 cp, or 1000 cp.

The first adhesive layer 141 may physically contact the side surface 111 of the substrate 110 and the second adhesive layer 142. For example, the first adhesive layer 141 may be formed by using a material with high viscosity and low fluidity. In some embodiments, the viscosity of the second adhesive layer 142 before curing is less than the viscosity of the first adhesive layer 141 before curing. In some embodiments, the viscosity of the first adhesive layer 141 before curing is about 2000 cp to 10000 cp, such as 4000 cp, 6000 cp or 8000 cp.

In some embodiments, the second adhesive layer 142 and the first adhesive layer 141 have different compositions or composition ratios. In some embodiments, the first adhesive layer 141 and the second adhesive layer 142 include at least one of polyurethane acrylate (PUA), epoxy acrylate, and silicone resin. In some embodiments, the first adhesive layer 141 and the second adhesive layer 142 further include a reactive diluent, such as iso-Bornyl acrylate (IBOA). In some embodiments, the first adhesive layer 141 and the second adhesive layer 142 contain different proportions of reactive diluents, so that the first adhesive layer 141 and the second adhesive layer 142 have different viscosities before curing. In some embodiments, the first adhesive layer 141 may be formed through coating. In some embodiments, the second adhesive layer 142 may be formed through spraying. In some embodiments, the first adhesive layer 141 is formed after the second adhesive layer 142 is cured. After the first adhesive layer 141 is cured, an interface IF may be formed between the first adhesive layer 141 and the second adhesive layer 142, and the first adhesive layer 141 and the second adhesive layer 142 may seal the interface between the optical layer 130 and the substrate 110, so as to avoid affecting the reliability of the display panel 10.

In the process of cutting the optical layer 130, the second adhesive layer 142 and the first adhesive layer 141, since the second adhesive layer 142 adjacent to the optical layer 130 is less likely to contain bubbles, a cutting force applied to the optical layer 130 is relatively average, thereby improving flatness of a cutting surface of the optical layer 130. In some embodiments, after cutting the optical film 132, the encapsulant 131, the second adhesive layer 142 and the first adhesive layer 141, a side surface S32 of the optical film 132, a side surface S31 of the encapsulant 131, a surface S42 of the second adhesive layer 142 facing away from the substrate 110 and a surface S41 of the first adhesive layer 141 facing away from the substrate 110 are exposed, and the surface S42 of the second adhesive layer 142, the side surface S31 of the encapsulant 131 and the side surface S32 of the optical film 132 are aligned with each other. In some embodiments, there are bubbles BU in the first adhesive layer 141, and a cutting path passes through the bubbles BU, so that bubble holes BH may appear on the surface S41 of the first adhesive layer 141. In some embodiments, ultraviolet (UV) laser or infrared (IR) laser may be used to perform cutting on the optical film 132, the encapsulating glue 131, the second adhesive layer 142 and the first adhesive layer 141.

In some embodiments, the display panel 10 further includes a chip bonding film CF, the chip bonding film CF is located in the external pin wiring area LA, and the chip bonding film CF is electrically connected to the substrate 110 through the pads PD. In some embodiments, pins of the chip bonding film CF are electrically connected to the pads PD through a conductive glue (for example, anisotropic conductive glue). In some embodiments, the chip bonding film CF is further electrically connected to an external driving chip (not shown).

In the following descriptions, another embodiment of the invention will be continued to be described with reference of FIG. 2A to FIG. 2B, and reference numbers of the components and a part of contents of the aforementioned embodiment are also used in the following embodiment, where the same reference numbers denote the same or like components, and descriptions of the same technical contents are omitted. The embodiment of FIG. 1A to FIG. 1B may be referred for descriptions of the omitted parts, and detailed descriptions thereof are not repeated in the following embodiment.

Figure 2A:
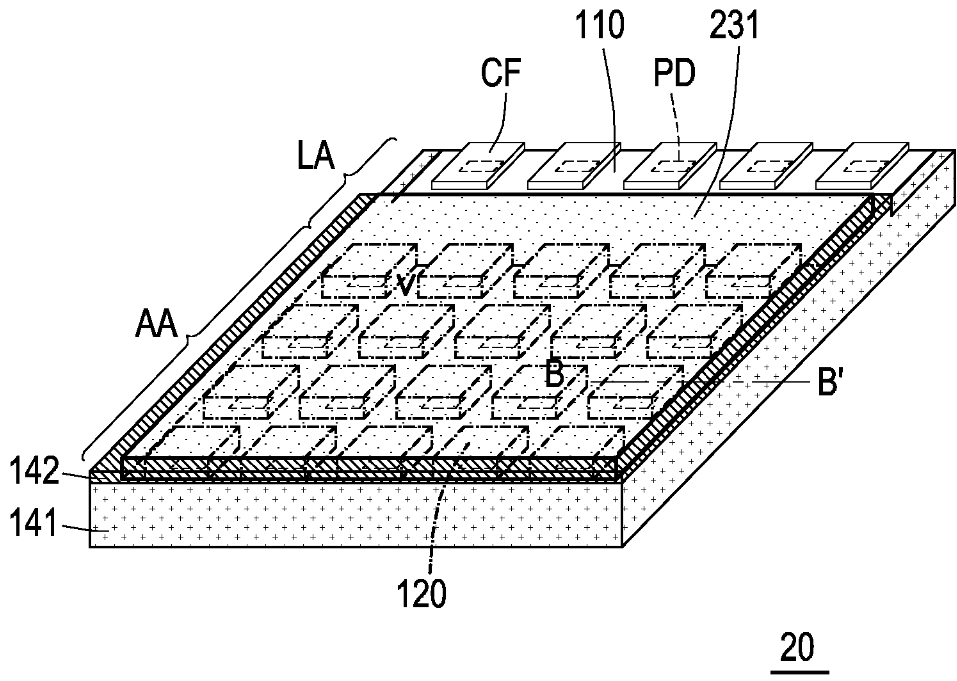
FIG. 2A is a schematic partial top view of a display panel 20 according to an embodiment of the invention.

FIG. 2A is a schematic partial top view of a display panel 20 according to an embodiment of the invention. FIG. 2B is a schematic cross-sectional view viewing along a section line B-B' in FIG. 2A. The display panel 20 includes the substrate 110, the display units 120, an optical layer 230, the first adhesive layer 141 and the second adhesive layer 142. The optical layer 230 is located on the display units 120. The optical layer 230 includes an encapsulant 231 and the optical film 132, and the encapsulant 231 is located between the substrate 110 and the optical film 132. The first adhesive layer 141 contacts the side surface 111 of the substrate 110. The second adhesive layer 142 is located between the first adhesive layer 141 and the optical film 132, and there is an interface IF between the second adhesive layer 142 and the first adhesive layer 141.

Figure 2B:
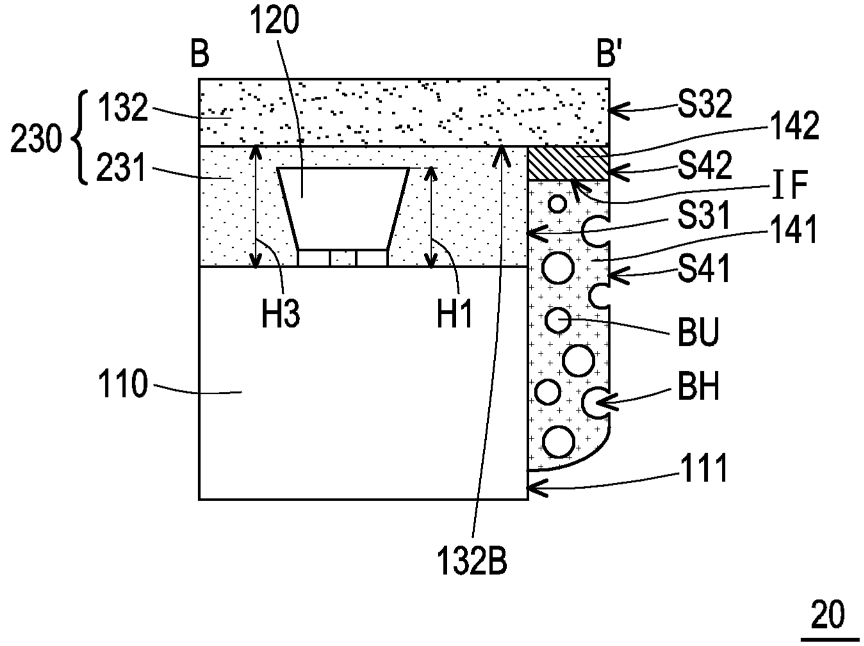
FIG. 2B is a schematic cross-sectional view viewing along a section line B-B' in FIG. 2A.

A main difference between the display panel 20 shown in FIG. 2A to FIG. 2B and the display panel 10 shown in FIG. 1A to FIG. 1B is that the encapsulant 231 of the optical layer 230 of the display panel 20 does not completely cover the bottom surface 132B of the optical film 132, and the second adhesive layer 142 and the first adhesive layer 141 cover the side surface S31 of the encapsulant 231 and the side surface 111 of the substrate 110.

In some embodiments, the second adhesive layer 142 only covers the side surface S31 of the encapsulant 231. In some embodiments, the second adhesive layer 142 physically contacts the bottom surface 132B of the optical film 132 and the side surface S31 of the encapsulant 231, thereby sealing the interface between the optical film 132 and the encapsulant 231. In some embodiments, the first adhesive layer 141 covers the side surface S31 of the encapsulant 231 and the side surface 111 of the substrate 110 at the same time to seal the interface between the encapsulant 231 and the substrate 110.

In some embodiments, the second adhesive layer 142 completely covers the side surface S31 of the encapsulant 231, and the second adhesive layer 142 further extends to the side surface 111 of the substrate 110, so that the second adhesive layer 142 may seal the interface between the optical film 132 and the encapsulant 231 and the interface between the encapsulant 231 and the substrate 110 at the same time. In this case, the first adhesive layer 141 may only cover the side surface 111 of the substrate 110.

In some embodiments, the display panel 20 is a transparent display panel, and the encapsulant 231 may include a transparent glue material, such as a PUR glue, an epoxy resin, a silicone glue, or other suitable glue materials, which is not limited by the invention. In some embodiments, a height H3 of the encapsulant 231 is greater than the height H1 of the display unit 120, so that the encapsulant 231 completely covers the display unit 120.

In the process of cutting the optical film 132, the second adhesive layer 142 and the first adhesive layer 141, since the second adhesive layer 142 adjacent to the optical film 132 is less likely to contain bubbles, the cutting force applied to the optical film 132 is relatively average, thereby improving the flatness of the cutting surface of the optical film 132. In some embodiments, after cutting the optical film 132, the second adhesive layer 142 and the first adhesive layer 141, the side surface S32 of the optical film 132, the surface S42 of the second adhesive layer 142 facing away from the encapsulant 231 and the surface S41 of the first adhesive layer 141 facing away from the substrate 110 are exposed, and the surface S42 of the second adhesive layer 142 may be aligned with the side surface S32 of the optical film 132. In some embodiments, since the cutting path passes through the bubbles BU in the first adhesive layer 141, bubble holes BH may appear on the surface S41 of the first adhesive layer 141 after cutting.

In summary, the display panel of the invention may improve the flatness of the cutting surface of the optical film by disposing the second adhesive layer that is less likely to contain bubbles between the first adhesive layer that easily contains bubbles and the optical film, thereby improving a cutting yield of the display panel.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A display panel, comprising:

a substrate;

a plurality of display units disposed over a top surface of the substrate;

an optical layer disposed on the display units, wherein at least a portion of an orthographic projection of the optical layer on the substrate falls within the top surface of the substrate;

a first adhesive layer contacting a side surface of the substrate; and a second adhesive layer disposed between the first adhesive layer and the optical layer and contacting a surface of the optical layer facing the substrate, wherein an interface exists between the second adhesive layer and the first adhesive layer, and an orthographic projection of the second adhesive layer on the substrate is outside the top surface of the substrate.

2. The display panel according to claim 1, wherein the second adhesive layer and the first adhesive layer have different compositions.

3. The display panel according to claim 1, wherein there are bubbles in the first adhesive layer.

4. The display panel according to claim 1, wherein a surface of the first adhesive layer facing away from the substrate has bubble holes.

5. The display panel according to claim 1, wherein a viscosity of the second adhesive layer before curing is less than a viscosity of the first adhesive layer before curing.

6. The display panel according to claim 1, wherein the optical layer comprises an encapsulant and an optical film, and the encapsulant is located between the substrate and the optical film and between the display units.

7. The display panel according to claim 6, wherein the encapsulant is further located between the second adhesive layer and the optical film.

8. The display panel according to claim 7, wherein a side surface of the second adhesive layer, a side surface of the encapsulant, and a side surface of the optical film are aligned with each other.

9. The display panel according to claim 6, wherein the second adhesive layer covers a side surface of the encapsulant.

10. The display panel according to claim 9, wherein a surface of the second adhesive layer facing away from the encapsulant is aligned with a side surface of the optical film.

* * * * *